United States Patent [19]

Iturralde

[11] Patent Number: 5,711,848

[45] Date of Patent: Jan. 27, 1998

[54] NON-PRODUCT PATTERNED PARTICLE TEST WAFER AND TESTING METHOD THEREFOR

[75] Inventor: Armando Iturralde, San Antonio, Tex.

[73] Assignees: Sony Corporation, Tokyo, Japan; Sony Electronics, Inc., Park Ridge, N.J.

[21] Appl. No.: 471,245

[22] Filed: Jun. 6, 1995

[51] Int. Cl.$^6$ ................................................. H01L 21/00
[52] U.S. Cl. .................................. 156/627.1; 156/657.1
[58] Field of Search ........................... 156/626.1, 627.1, 156/656.1, 657.1, 662.1, 345; 437/233, 8; 216/61, 86

[56] References Cited

U.S. PATENT DOCUMENTS 4,863,548  9/1989  Lee ........................................... 156/345

Primary Examiner—William Powell
Attorney, Agent, or Firm—Wood, Herron & Evans, P.L.L.

[57] ABSTRACT

A method for testing a semiconductor wafer processing step. An overlying electrical structure is created on a bare wafer to form a test wafer which simulates the surface contours of production wafers that will be exposed to the tested processing step. The overlying electrical structure of the test wafer is created using the same processing steps are used in manufacturing the overlying electrical structures of production wafers. Although the test wafers have the same surface contour as the production wafers they simulate, the test wafers are less expensive to manufacture because the test wafers do not include any underlying layers found in the production wafers which are not exposed during the tested processing step, and therefore the steps which form these layers can be omitted when making test wafers.

11 Claims, 2 Drawing Sheets

NON-PRODUCT PATTERNED PARTICLE TEST WAFER AND TESTING METHOD THEREFOR

FIELD OF THE INVENTION

The present invention relates to testing procedures for detecting and reducing particles in semiconductor manufacturing processes.

BACKGROUND OF THE INVENTION

A primary limitation on the productivity of a semiconductor manufacturing facility is contamination of wafers and corresponding reductions in yield. Typically a wafer includes a number of circuits which are diced (separated) and packaged for sale. A fatal defect in one die, while not necessarily affecting the other dice, typically renders the defective die commercially worthless.

One frequent cause of defects in dice is particulate contamination of the surface of the wafer during manufacturing. Efforts to improve yield often focus on reducing such particulate contamination.

A manufacturing processing step is typically rigorously tested for sources of particulate contamination, or other damage to wafers. Such testing typically involves processing one or more wafers through the processing step and then inspecting the wafers for signs of particulate contamination or other damage.

Production wafers that have undergone a number of processing steps have a substantial economic value and therefore represent a substantial loss if damaged. For this reason, processing steps are typically tested using bare wafers rather than production wafers; only after bare wafer testing indicates satisfactory performance are production wafers processed through the processing step.

SUMMARY OF THE INVENTION

It has been found that the particle contamination which is experienced by a bare wafer when passed through a processing step is not necessarily correlated to the particle contamination which is experienced by a production wafer when passed through the same processing step. One explanation for the differing behaviors of bare wafers as compared to production wafers is that the patterned surface of the production wafer interacts differently with particulate contaminants than the bare, smooth surface of new bare wafers.

Unfortunately, economic considerations mitigate against the use of production wafers to test processing steps. Accordingly, there is a need for a testing procedure which produces test results closely correlated to those obtained with production wafers, without risking the economic losses which arise from contamination of a production wafer.

The invention meets this need by providing a non-product patterned particle test wafer which interacts with particulate contamination in a manner closely correlated to the behavior of production wafers, but does not represent a substantial economic investment that is subject to loss upon contamination. Specifically, the test wafer is made by applying existing processing steps to a bare wafer, so that the surface of the test wafer has the same contours as the surface of the actual production wafers which will be exposed to the tested processing step during production. However, when forming test wafers, many additional processing steps are omitted, specifically, additional processing steps which, when applied to production wafers during manufacture, do not substantially affect the surface contours of the production wafers when the production wafers are exposed to the tested processing step, are omitted when forming test wafers. Because these additional processing steps are not applied to the test wafer, the cost of forming test wafers is substantially less expensive than the cost of preparing actual production wafers having the same surface contours. At the same time, because the surface contours of the test wafers and actual production wafers are substantially identical, tests of a processing step using test wafers should be well correlated to the test results that would have been obtained using actual production wafers.

In specific embodiments of the invention, the test wafers are made by forming a first layer on a bare wafer, forming a second layer on top of the first layer, and then selectively etching the second layer to expose the first layer. If the first layer is metal and the second layer is oxide, this procedure produces a test wafer which simulates the surface characteristics of a production wafer prior to deposition of a second, third or subsequent metal layer. If the first layer is a field oxide grown on the surface of the bare wafer and the second layer is a polysilicon layer, this procedure produces a test wafer which simulates the surface characteristics of a production wafer prior to deposition of a second oxide layer.

In these specific embodiments, when a layer is etched to form a test wafer, this etching is performed with the same reticle or mask as is used in etching this layer in the production wafers. Thus, the surface contours of the test wafer are patterned in exactly the same way as the production wafers.

The same material may be used for the various layers in the test wafer as are used in the production wafers; however, this may not be necessary. For example, polysilicon may be used in place of metal and/or oxides as needed to save cost, so long as the surface contours of the layers are similar the material may not need to be identical to production wafers to obtain a satisfactory correlation of test wafer performance to production wafer performance.

In the specific embodiments discussed below, test wafers are used to measure particulate accumulation by using an inspection tool to measure particulate deposits on the test wafer prior to and after a processing step. However, other kinds of contamination may be measured and tested using test wafers, with equal benefit.

Test wafers may be reused so long as the processing step being tested does not form a layer on the test wafer which cannot be selectively removed and does not so contaminate the surface of the test wafer as to prevent meaningful measurement of further contamination during further tests of the processing step.

The above and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

Figure 1:
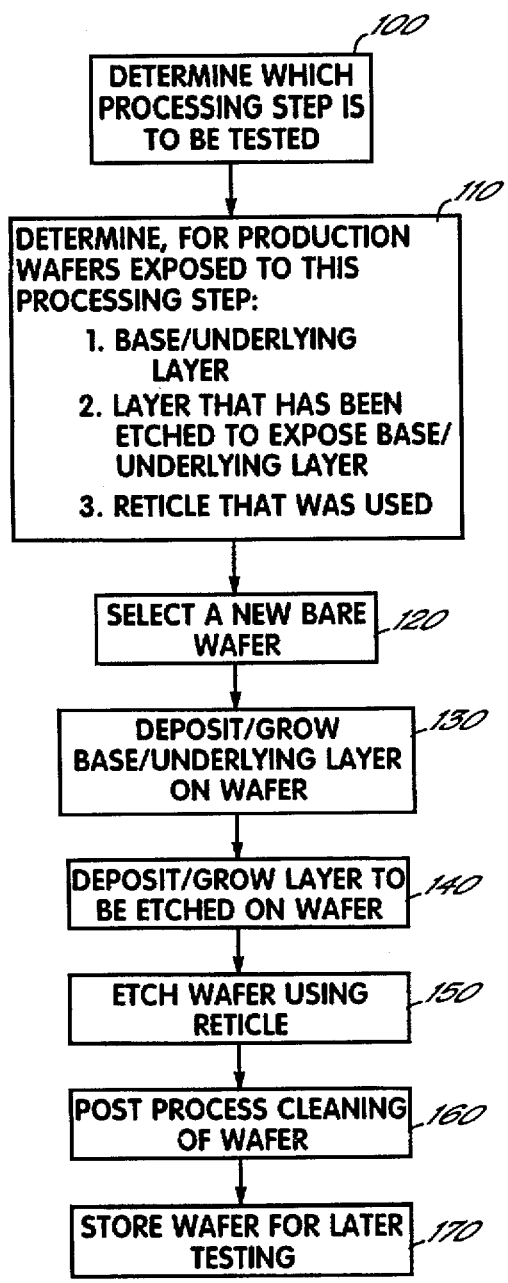
FIG. 1 is a flow chart of processing steps performed to create an overlying electrical structure on a bare wafer to form a test wafer simulating the surface contours of production wafers for testing a processing step.

Referring to FIG. 1, in accordance with the principles of the present invention, a test wafer is formed to test a processing step, activity or condition, by first determining 100 which processing step, activity or condition in the manufacturing environment is to be tested. Thereafter, one must determine 110 for production wafers exposed to this processing step, activity or condition, what the surface profile of the production wafer will be when it is exposed to this processing step, activity or condition.

For brevity, in the following discussion, any processing step, activity, or condition to which wafers may be subjected during semiconductor manufacturing will be referred to as a "processing step". It will be understood that, under this definition, a processing step may include, in addition to steps such as exposure of the wafer to gasses in a vacuum chamber, other activities such as transporting a wafer from one chamber to another, or exposing the wafer to a condition such as a temperature, or contaminants found in the air of a manufacturing clean-room.

To determine the surface profile of a production wafer when it is exposed to a processing step, one must determine at least (1) the base or underlying layer that is exposed on the surface of the production wafer during the step of interest, (2) any overlying layer that has been etched to expose the base or underlying layer during the step of interest, and (3) the reticle or mask that was used to etch the overlying layer.

Once these elements have been determined, one may begin to form test wafers. First, a new bare wafer, i.e. a wafer which has not had any layers deposited or grown on its intrinsic silicon surface, is selected 120. Next, the base or underlying layer which is exposed on production wafers during the tested processing step, is grown or deposited 130 on the bare wafer. Subsequently, the layer which is etched from a production wafer to expose the underlying layer when the production wafer is exposed to the tested processing step, is grown or deposited 140. Next, the test wafer is etched 150 using the same reticle or mask as is used on production wafers to etch the same layer.

At the completion of the foregoing steps, the test wafer will have the same surface contours as the production wafer when the production wafer is exposed to the tested processing step, and will have the same material characteristics on its surface. Thus, the behavior of the test wafer during testing of the processing step should be well correlated to the behavior of production wafers.

Test wafers formed in the preceding manner are subjected to post process cleaning 160 and then is stored 170 for use in subsequent testing.

Referring now to FIGS. 2A-5C, various examples of test wafers are useful in understanding and illustrating principles of the present invention.

Figure 2A:
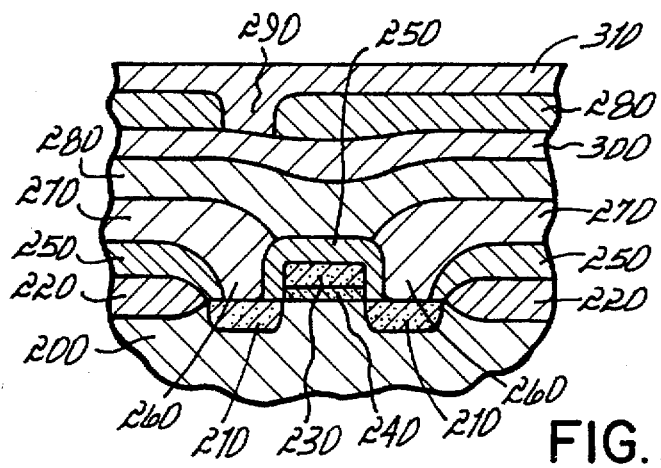
FIG. 2A is a partial cross-sectional illustration of electrical structures formed on a semiconductor wafer to make electrical circuitry.

Referring to FIG. 2A, a typical production wafer from a metal-oxide-semiconductor (MOS) process has a number of layers formed during processing of the wafer which create electrical circuits. Specifically, the intrinsic silicon body 200 of the wafer has diffusion regions 210 grown therein by exposure of the surface of the wafer 200 to a dopant. Furthermore, the surface 200 of the wafer has a first field oxide layer 220 grown thereon in areas which will not contain active semiconductor elements.

Transistors are formed in the surface of the wafer 200 by first forming field oxide 220 and then forming a gate oxide 230 by exposing a surface of the wafer 200 to oxygen. Next a polysilicon layer is deposited over the gate oxide. The polysilicon and gate oxide layers are then selectively etched to leave gate conductors 240 supported above thin gate insulating oxide layers 230. Next the wafer is exposed to dopants which form diffusion regions 210 as noted above.

After forming transistors in the surface of wafer 200, these transistors are interconnected by sequences of metal layers. First, a second layer of oxide 250 is deposited over the surface of the entire wafer by exposing the wafer 200 to oxygen. Then, this oxide is selectively etched to form vias 260. A metal layer 270 (metal-1) is then deposited over the second layer of oxide 250 to form contacts to the diffusion regions 210 and to polysilicon gate contacts 240.

Metal layers are interconnected to other metal layers by steps similar to those described above. Specifically, additional oxide layers 280 are deposited over surface of the wafer, and these oxide layers are etched to form vias such as 290 which are used to interconnect each metal layer to the metal layer below it. In this manner, a second metal layer 300 (metal-2) and a third metal layer 310 (metal-3) and subsequent metal layers are interconnected.

Figure 3A:
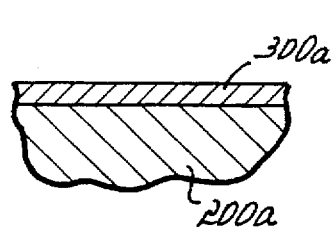
FIGS. 3A, 3B and 3C are cross-sectional views of a test wafer illustrated at various times during creation of overlying electrical structures to simulate the surface of the production wafer of FIG. 2A prior to deposition of a metal-3 layer.
Figure 3B:
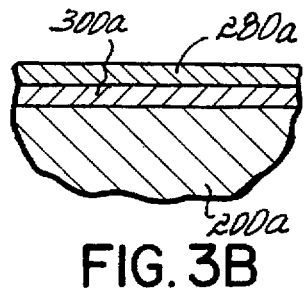
Figure 3C:
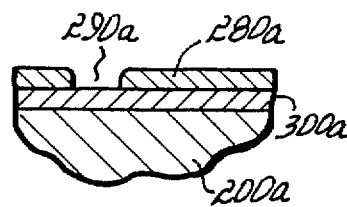

Referring now to FIGS. 3A-3C, at the time the metal-3 layer 310 is deposited upon the production wafer shown in FIG. 2A, the surface of wafer 200 is covered by the fourth oxide layer 280, with the exception of vias such as 290 which are etched through the fourth oxide layer 280, exposing the metal-2 layer 300. To simulate the surface contours of the production wafer at this stage in the manufacturing process, a test wafer is formed by first depositing a layer 300a of metal over the surface of a bare wafer 200a, as illustrated in FIG. 3A. Next, an oxide layer 280a is deposited over metal layer 300a, as shown in FIG. 3B. Finally, oxide layer 280a is etched using the same reticle or mask as is used in the manufacturing process discussed above, to form a via 290a in the surface of oxide layer 280a exposing metal layer 300a.

By comparing the structure of FIG. 3C to the structure of FIG. 2A with the metal-3 layer 310 removed, it will be seen that the surface contours and the material characteristics of these surfaces are identical. As a result, the test wafer shown in FIG. 3C, when subjected to any processing step, will behave similarly to a production wafer which is between the step which etches the fourth oxide layer and the step which deposits the metal-3 layer. However, it will be noted that the test wafer shown in FIG. 3C was formed by substantially fewer processing steps then the complete production wafer shown in FIG. 2A. Therefore, the test wafer shown in FIG. 3C can be used in testing a metal-3 deposition processing step without risk of substantial economic loss as compared to using a production wafer such as is illustrated in FIG. 2A.

Figure 4A:
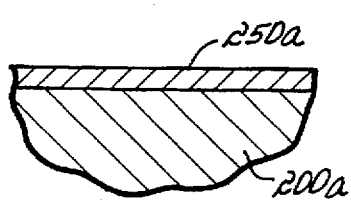
FIGS. 4A and 4B are cross-sectional views of a test wafer illustrated at various times during creation of overlying electrical structures to simulate the surface of the production wafer of FIG. 2A prior to deposition of a metal-1 layer.
Figure 4B:
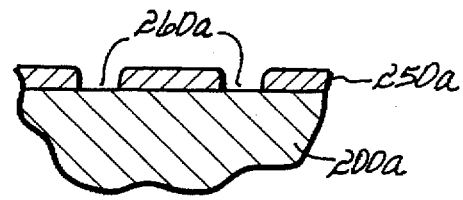

Referring now to FIGS. 4A-4B, another example in which test wafers may be advantageously used to test a processing step is illustrated. Specifically, these figures illustrate formation of a test wafer which simulates the state of the production wafer of FIG. 2A just before deposition of metal-1 layer 270. To make this test wafer, an oxide layer 250a is first formed on a bare wafer 200a(FIG. 4A). Next, the oxide layer 250a is etched (FIG. 4B) using the same reticle or mask used when etching oxide layer 250 in FIG. 2A. As a result, vias 260a are formed in the surface of oxide layer 250a, exposing the intrinsic silicon surface of wafer 200a.

By comparing FIG. 4B to the structure of FIG. 2A with metal-1 layer 270 and all overlying layers removed, it will be seen that the test wafer of FIG. 4B accurately simulates the surface contours of the production wafer of FIG. 2A at this stage of manufacturing.

Figure 5A:
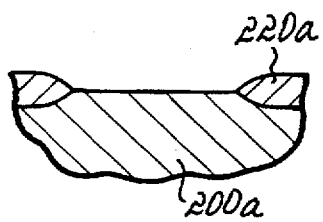
FIGS. 5A, 5B and 5C are cross-sectional views of a test wafer illustrated at various times during creation of overlying electrical structures to simulate the surface of the production wafer of FIG. 2A prior to deposition of the second oxide layer.
Figure 5B:
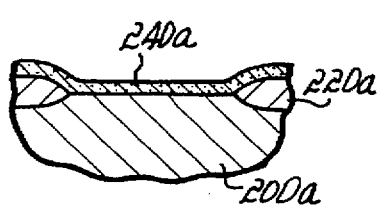
Figure 5C:
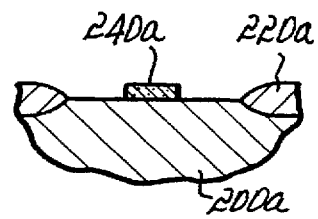

Now referring to FIGS. 5A-5C, a third use of a test wafer to simulate the surface contours prior to growth of the second oxide layer 250 is illustrated. To simulate the structure of wafer 200 of FIG. 2A prior to the growth of the second oxide layer 250, a field oxide layer 220a is grown (FIG. 5A) on the surface of a blank wafer 200a. Next, a polysilicon layer 240a is formed (FIG. 5B) on top of the oxide layer 220a. Finally, polysilicon layer 240a is etched (FIG. 5C), leaving a gate conductor element 240a having the same sizes and shapes as the gate conductor element 240 in FIG. 2A.

By comparing FIG. 5C to the structure of FIG. 2A, it will be seen that the surface contours of the structure of FIG. 5C are identical to the surface contours of the structure of the FIG. 2A, if the second oxide layer 250 and all higher layers are removed. Therefore the test wafer illustrated in FIG. 5C will have a good correlation in performance and contamination behavior to the processing wafer just before addition of the second oxide layer 250.

It will be noted that the test wafer illustrated in FIG. 5C, does not contain a gate oxide layer 230 as is contained in the production wafer shown in FIG. 2A. This layer has been omitted from the test wafer because this layer is not exposed during deposition of the metal layer 270, and therefore it is not necessary to simulate the gate oxide layer 230 when forming the test wafer shown in FIG. 5C. (Gate oxide layers are typically very thin and do not substantially change the surface contours when absent from beneath polysilicon layer 240a.)

Figure 6:
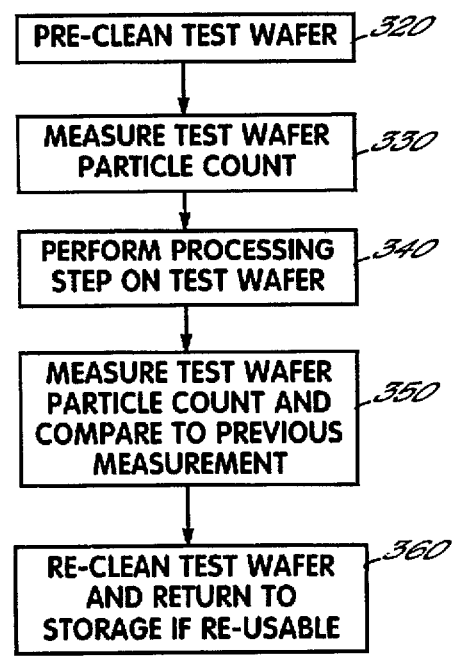
FIG. 6 is a flow chart of processing steps undertaken to test a semiconductor wafer processing step using a test wafer.

Once a test wafer has been formed, it is used to test a processing step as illustrated in FIG. 6. Specifically, to test a processing step for particle generation, a test wafer is pre-cleaned 320 and then inserted into an inspection tool to measure 330 the number of particles on the surface of the test wafer. One suitable inspection tool is the 7600 Wafer Inspection Machine, available from Tencor of Mountain View, Calif.

After measuring the number of particles on the test wafer, the processing step to be tested is performed 340 with a test wafer. After performing the step, the test wafer is again inspected 350 to determine the number of particles on the test wafer. This measurement is compared to the previous measurement to determine the number of particles added during the processing step.

If the number of particles added during the processing step is excessive, efforts may be made to change the processing step to reduce the number of particles generated.

Test wafers may be reused in subsequent re-tests of the processing step, so long as the processing step does not form a layer on a test wafer which cannot be selectively removed, and so long as the processing step does not so contaminate the surface of the test wafer as to prevent meaningful measurement of further contamination during re-tests of the processing step. If the test wafer is re-usable, is it prepared for re-use by re-cleaning 360 the surface of the test wafer and returning the test wafer to storage.

It will be noted that test wafers should accurately simulate the surface contours of a production wafer. This simulation is most accurate when the same materials are exposed on the test wafer as are exposed on the production wafer. However, it may not be necessary to use the same materials on the test wafer as are used on the production wafer. For example, a relatively inexpensive layer such as polysilicon may be used in place of a relatively expensive layer such as metal layers and/or oxide, to save in cost in producing test wafers. The necessity for using the same materials in test wafers as are used in production wafers can be determined by correlating the behavior of test wafers during final testing a given processing step to the performance of production wafers in the same processing step during production. If the same materials are not critical, then costs savings may be realized by substituted less expensive materials when forming test wafers.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A method of testing and thereafter including a tested processing step into a semiconductor wafer manufacturing process, comprising:

providing a bare wafer, then creating an overlying electrical structure from said bare wafer to form a test wafer, by applying to said bare wafer at least one existing semiconductor wafer processing step which will precede said tested processing step when manufacturing production wafers, then applying said tested processing step to said test wafer, and evaluating said test wafer to determine whether said test wafer has been subjected to damage by said tested processing step, and thereafter manufacturing a production wafer by first applying at least one additional processing step to a bare wafer to form an underlying electrical structure, then applying said at least one existing processing step to form said overlying electrical structure, and then applying said tested processing step.

2. The method of claim 1 wherein multiple existing semiconductor wafer processing steps are applied to form said test wafer and manufacture said production wafer, said multiple existing processing steps including forming a first layer on top of a wafer, forming a second layer on top of said first layer, and selectively etching said second layer to expose said first layer.

3. The method of claim 2 wherein said first layer is a metal layer and said second layer is an oxide layer.

4. The method of claim 2 wherein multiple additional processing steps are applied to manufacture said underlying electrical structure in a production wafer, said multiple additional processing steps comprising forming an oxide layer from a wafer by exposure to oxygen, and forming diffusion regions from said wafer by exposure to a dopant.

5. The method of claim 2 wherein an additional processing step applied to manufacture said underlying electrical structure in a production wafer comprises forming a thin film layer by deposition onto a wafer.

6. The method of claim 1 wherein multiple existing semiconductor wafer processing steps are applied to form said test wafer and manufacture said production wafer, said multiple existing processing steps comprising forming an oxide layer from a wafer by exposure to oxygen, forming a polysilicon layer by deposition on said wafer, and selectively etching said polysilicon layer to expose said oxide layer and said wafer.

7. The method of claim 6 wherein an additional processing step applied to manufacture said underlying electrical structure in a production wafer comprises forming a gate oxide layer by exposure to oxygen.

8. The method of claim 1 wherein multiple existing semiconductor wafer processing steps are applied to form said test wafer and manufacture said production wafer, said multiple existing processing steps comprising forming an oxide layer from a wafer by exposure to oxygen, and selectively etching said oxide layer to form vias in said oxide layer.

9. The method of claim 1 further comprising modifying said tested processing step upon detection of damage to said test wafer during said evaluating, and then repeating said applying and evaluating.

10. The method of claim 9 further comprising making a new test wafer from a bare wafer by repeating said providing and creating, and wherein said applying and evaluating are repeated using said new test wafer.

11. The method of claim 1 wherein said evaluating comprises detecting particulate deposits on said test wafer prior to application of said tested processing step to said test wafer, detecting particulate deposits on said test wafer after application of said tested processing step to said test wafer, and comparing particulate deposits detected prior to and after said tested processing step to arrive at a number of particulate deposits added during said tested processing step.

* * * * *